US006281723B1

(12) United States Patent
Tailliet

(10) Patent No.: US 6,281,723 B1
(45) Date of Patent: Aug. 28, 2001

(54) DEVICE AND METHOD FOR POWER-ON/POWER-OFF CHECKING OF AN INTEGRATED CIRCUIT

(75) Inventor: François Tailliet, Seine (FR)

(73) Assignee: SGS-Thomson Microelectronics S.A., Gentilly (FR)

(*) Notice: Subject to any disclaimer, the term of this patent is extended or adjusted under 35 U.S.C. 154(b) by 0 days.

(21) Appl. No.: 08/993,071

(22) Filed: Dec. 18, 1997

(30) Foreign Application Priority Data

Dec. 19, 1996 (FR) .................................................. 96 15671

(51) Int. Cl.⁷ ...................................................... H03L 7/00
(52) U.S. Cl. ............................................................ 327/143
(58) Field of Search ................................. 326/87; 327/142, 327/143, 198

(56) References Cited

U.S. PATENT DOCUMENTS

| | | | |
|---|---|---|---|
| H497 | * 7/1988 | Piasecki | 327/143 |
| 4,716,323 | * 12/1987 | Wada et al. | 327/143 |
| 4,886,984 | * 12/1989 | Nakaoka | 327/143 |
| 4,970,408 | * 11/1990 | Hanke et al. | 327/143 |
| 5,027,006 | * 6/1991 | Queinnec et al. | 307/272.3 |
| 5,030,845 | * 7/1991 | Love et al. | 327/143 |
| 5,115,146 | * 5/1992 | McClure | 327/143 |
| 5,180,926 | * 1/1993 | Skripek | 327/143 |
| 5,287,011 | * 2/1994 | Koshikawa et al. | 327/143 |
| 5,442,312 | * 8/1995 | Walter | 327/143 |
| 5,581,206 | * 12/1996 | Chevallier et al. | 327/143 |
| 5,696,461 | * 12/1997 | Germini | 327/143 |
| 5,731,720 | * 3/1998 | Suzuki et al. | 327/143 |
| 5,804,996 | * 9/1998 | Verhaeghe et al. | 327/143 |
| 5,821,783 | * 10/1998 | Torimaru et al. | 326/87 |

* cited by examiner

Primary Examiner—Jeffrey Zweizig
(74) Attorney, Agent, or Firm—Wolf, Greenfield & Sacks, P.C.; James H. Morris; Theodore E. Galanthay

(57) ABSTRACT

A checking device to control the power-on or power-off operations in an integrated circuit comprises a voltage reference circuit biased by a bias circuit, and an output stage. The device further comprises a control circuit to activate or deactivate the bias circuit as a function of the prevailing mode of operation of the integrated circuit, and a capacitor. A dynamic detection circuit is also associated with a transistor for discharging the capacitor.

27 Claims, 6 Drawing Sheets

DEVICE AND METHOD FOR POWER-ON/POWER-OFF CHECKING OF AN INTEGRATED CIRCUIT

BACKGROUND OF THE INVENTION

1. Field of the Invention

The invention relates to an integrated circuit power-on/power-off checking device, namely a device to check power-on and power-off operations in an integrated circuit.

2. Description of the Related Art

A power-on/power-off checking device monitors the level of the supply voltage to enable, if necessary, the resetting of certain electronic elements such as sequential circuits and prevent access to certain electronic functions. The checking device therefore fulfills a detection function that is very important for the operating security of the integrated circuit, enabling the activated integrated circuit to be in a clearly determined state (a resetting state) and making it possible, when there are conditions of supply that do not comply with specifications, to prevent access to certain functions in order to preserve the integrity of the integrated circuit.

To obtain a high level of security, the common practice is to use a checking circuit with a voltage reference circuit enabling the detection of the level of the supply voltage with respect to a threshold voltage Vs established by the voltage reference circuit. A checking device of this type is described, for example, in the French patent application No. 96 01378.

A device of this kind includes a circuit for current biasing the voltage reference circuit, enabling the permanent detection of the level of the supply voltage. The point of connection between the voltage reference circuit and the bias circuit gives a detection signal capable of causing the switch-over of the inverters of an output stage. This output state delivers a neutralization or power-on reset signal POR that is applied to a resetting and inhibition circuitry of the integrated circuit.

As shown schematically in FIG. 1, this neutralization signal POR follows the level of the supply voltage Vdd so long as this level is below the detection threshold Vs. When the level is greater than the detection threshold Vs, the signal POR is drawn to zero volts.

When the signal POR follows the supply voltage Vdd, it is perceived as a "1" by the resetting and inhibition circuitry which is then activated. It will be noted however that this can be done only when the supply voltage Vdd has a sufficient level, at least equal to a level Vf, at which the circuitry can function. The detection threshold Vs is necessarily greater than this minimum level Vf. It is in the period of time when the voltage Vdd is between Vs and Vf that the resetting is done and that the locking of certain access paths is done through the pulse of the signal POR. As soon as the supply voltage Vdd is greater than the detection threshold Vs, the resetting and inhibition circuitry is deactivated and the integrated circuit is operational, reset and has all its electronic functions valid.

The constant current bias of the voltage reference circuit leads to permanent power consumption in the integrated circuit, even in standby mode, when the integrated circuit is not selected. In this standby mode, this consumption is highly inconvenient because it is greater than the consumption in standby mode of the rest of the integrated circuit. As an order of magnitude, the consumption is, for example, in the range of 10 micro-amperes for the control device alone, and some nano-amperes for the rest of the integrated circuit. When the integrated circuit is selected, this consumption of the control device becomes negligible with respect to the consumption of the other electronic functions of the circuit.

SUMMARY OF THE INVENTION

It is an object of the invention to reduce consumption in standby mode of the control device while at the same time enabling the device to fullfill its detection functions which are vital for the operating security of the integrated circuit.

One solution to this technical problem is achieved in an embodiment the invention by making provision, in the checking device, for a control circuit capable of activating or deactivating the bias circuit as a function of the prevailing mode of operation of the integrated circuit. In order to activate this bias circuit only for "risky modes" of operation, a capacitor may be provided in parallel with the bias circuit.

In this way, in standby mode and in the other possible modes of operation considered to be what are referred to as "no-risk" modes, the consumption of the control device is zero unless a power-on or power-off operation is detected through the capacitor, then leading to a transient consumption due to the charging or discharging of the capacitor.

The determination of the risky modes of operation depends on the integrated circuit considered (for example a circuit with or without a non-volatile memory, with series or parallel access) and on the application for which it is intended. For example, in certain cases, the mere selection of the integrated circuit makes it transition from a no-risk standby mode to a risky operating mode. In other cases, it is the selection of a special electronic function that has this effect. For example, it might be a writing operation in a non-volatile memory of the integrated circuit. A checking device of this kind however has the drawback of having a particularly slow response time in the event of a drop in voltage due to the discharge time of the capacitor. If the drop in voltage is swift, there is a risk that the detection will be delayed and will no longer enable either resetting or locking, the level of supply voltage being then already below the minimum threshold Vf of operation.

Thus, in one embodiment of the invention, the checking device also includes a transistor for discharging of the capacitor. This discharging transistor is controlled by a dynamic detection circuit to detect the negative transition of the supply voltage.

When this circuit detects a negative transition, the discharging transistor comes on, swiftly discharging the capacitor and thus preparing the device for the detection of a new build-up of voltage.

However, a dynamic circuit of this kind for the detection of negative transition may lead to untimely detection, for example, if the supply voltage oscillates because of non-stabilized supply. Thus, in one embodiment, the invention proposes a particular structure of the dynamic detection circuit comprising a filtering stage.

In this embodiment, it is possible to use the output of the dynamic detection circuit for the direct generation of the neutralization signal POR, without using the circuitry of the control device while at the same time preparing the checking device for the detection of a build-up of voltage.

In another variant of the checking device according to an embodiment of the invention, the material configuration enabling the selection of at least one of two possible threshold values. This variant may be very useful in practice. Indeed, we have seen that the detection threshold Vs has been typically fixed by the technology of the integrated circuit.

In certain cases however, it will also depend on the environment of applications for which the integrated circuit is intended. In some applications, an integrated circuit may be associated with other integrated circuits. It may be that the range of voltage within which each of these circuits can work is not the same for the others. For example, it is possible in one and the same application to have a microprocessor circuit working between 3 and 6 volts and a memory circuit working between 2 and 6 volts. Between 2 and 3 volts, the microprocessor circuit may send out incomprehensible commands that could prompt operations within the perfectly operational memory circuit. For this application, it is therefore not desirable to allow the memory circuit to work between 2 and 3 volts. A detection threshold of about 3.5 volts will be chosen for the control device of this memory circuit.

This variant of the invention therefore enables the serial production of integrated circuits with configurable detection thresholds enabling the programming of each circuit in the last layers produced in the manufacturing process, to meet the customer's requirements.

BRIEF DESCRIPTION OF THE DRAWINGS

Other features and advantages of the invention are described in detail in the following description, given by way of an indication that in no way restricts the scope of the invention and with reference to the appended drawings, of which.

DETAILED DESCRIPTION

The following description is given with respect to an integrated circuit with a P type substrate using MOS or CMOS technology although the concepts described apply to other structures as well.

Figure 2:
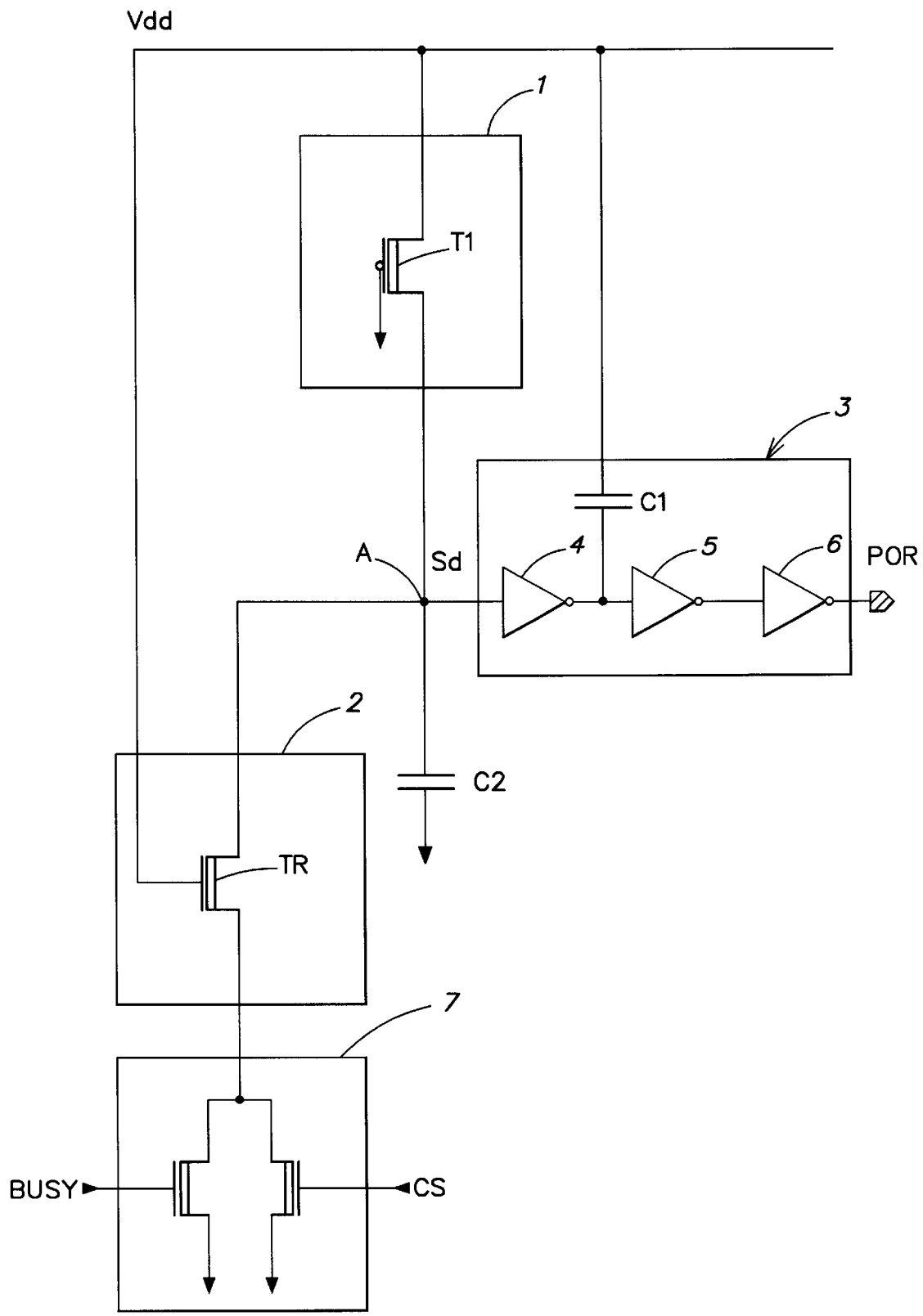
FIG. 2 shows a block diagram of a checking device according to an embodiment of the invention.

A checking device according to an embodiment of the invention is shown in FIG. 2. It comprises a voltage reference circuit 1 series-connected with a current bias circuit 2.

The input of the voltage reference circuit 1 receives the supply voltage Vdd of the integrated circuit. The connection point A between the output of the voltage reference circuit 1 and the bias circuit 2 gives a detection signal Sd. This detection signal Sd is applied to the input of an output stage 3 with inverters. This output stage 3 delivers a neutralization signal POR that enables the powering of a resetting and inhibition circuitry that is not shown.

Figure 1:
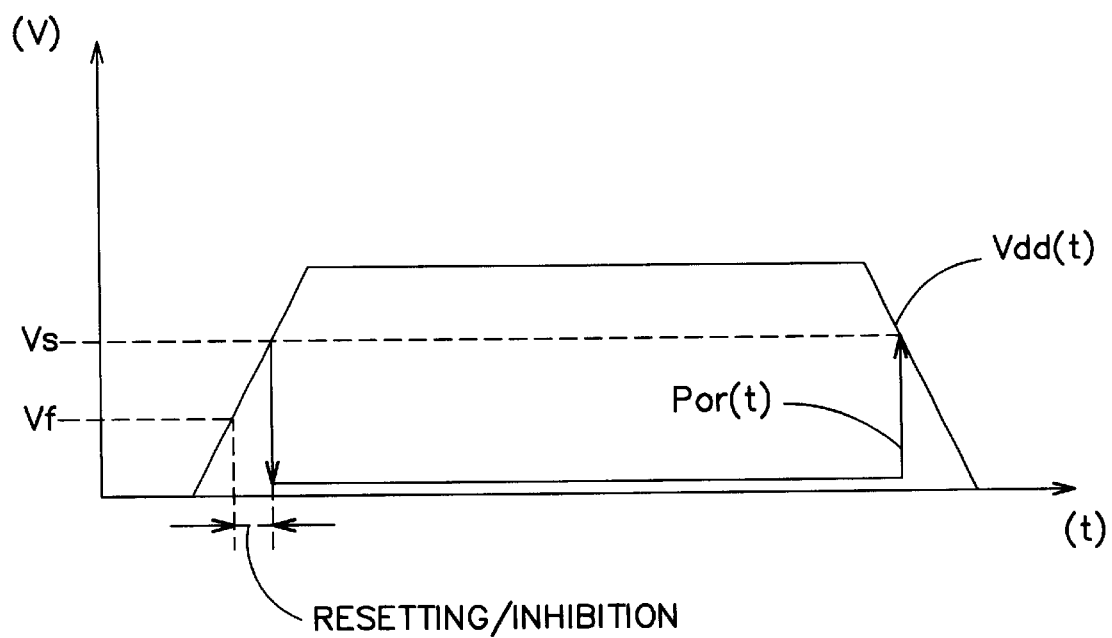
FIG. 1 shows a timing diagram representing the neutralization signal POR and the supply voltage Vdd of the integrated circuit.

In the exemplary embodiment shown in this FIG. 1 in MOS technology, the voltage reference circuit comprises a native P type MOS transistor T1. Its gate is connected to the ground of the circuit and its source is connected to the supply voltage Vdd.

The bias circuit 2 comprises a resistive transistor TR enabling the build-up of a current I at the node A as soon as the supply voltage Vdd is sufficient, namely as soon as it is greater than the threshold Vt1 of the transistor T1.

A voltage reference circuit of this kind biased by a current I sets up a switch-over threshold Vs equal to the threshold voltage Vtp of the native transistor P (T1), giving about 1.5 volts.

Other embodiments of the voltage reference circuit 1 are possible, especially to set up a switch-over threshold that is higher or more stable in temperature variations. The choice of the embodiment has no influence over the principle of the invention. Here below, it shall be seen how, in one variant, a voltage reference circuit is obtained with a threshold Vs that can be configured.

An embodiment of the output stage 3 comprises at least one first inverter 4 to deliver the neutralization signal POR. In practice, it has other inverters 5 and 6 to reshape the neutralization signal POR. It also has a starting capacitor C1, connected between the output of the first inverter 4 and the supply voltage Vdd.

The working of the neutralization device described with reference to FIGS. 1 and 2 is briefly as follows: when the integrated circuit is activated, the supply voltage Vdd increases gradually. At the outset, this supply voltage Vdd is not sufficient to bring about the operation of the electronic elements. The starting capacitor C1 then makes it possible to force the neutralization signal POR to follow the supply voltage Vdd as depicted in FIG. 1.

As soon as the supply voltage Vdd is sufficient, at least for the first inverter 4, this operation is confirmed and the signal POR follows the signal Vdd.

When the supply voltage Vdd becomes greater than the switch-over threshold Vs laid down by the voltage reference circuit 1, the node A, previously drawn towards zero volts by the bias circuit 2, rises to Vdd. The first inverter 4 and the reshaping inverters 5 and 6 switch over and the signal POR is set at zero volts (FIG. 1).

Conversely, when the supply voltage Vdd drops below the switch-over threshold Vs, the neutralization signal POR follows the level of the supply voltage Vdd until the integrated circuit is deactivated.

An operation of this kind enables a resetting and inhibition circuitry (not shown) to position the integrated circuit in a state that is defined (by the resetting of the sequential circuits) and reliable (through the fact of having locked access paths) not permitting vital operations in the time interval between the thresholds Vs and Vf.

For further details, it may be useful to refer to the contents of the French application No. 96 01378.

One embodiment of the starting capacitor C1, is a low capacitance capacitor of the order of one-tenth of a picofarad (1pf=$10^{-12}$ farad). Choosing a capacitor with a capacitance of appropriate value, about ten times greater than the value needed, allows the capacitor C1 to dictate a minimum pulse duration due to the associated time constant. This minimum pulse duration makes it possible, even in the event of sudden power-on or power-off operations, to have the minimum time needed to carry out the resetting and locking operations.

The switch-over threshold Vs maybe fixed by the voltage reference circuit. In the example shown in FIG. 2, it is defined by the threshold voltage Vt1 of the P type transistor T1 which is about 1.5 volts.

It is possible to have a different switch-over threshold by adding other transistors that are series-connected with the transistor T1 and diode-connected. In this way, the switch-over threshold Vs is equal to the sum of the values of threshold voltage of the series-connected transistors. Thus, in the example shown in FIG. 3, the voltage reference circuit 1A includes a second P type MOS transistor T2 that is diode-connected, namely with its gate connected to its drain, its drain being connected to the source of the transistor T1 and its source being connected to the supply voltage Vdd. In this way, the switch-over threshold Vs of the device is increased by one diode threshold (0.7 V) giving 2.2 volts instead of 1.5 volts.

Advantageously, a physical configuration circuit are provided in the invention, enabling the checking device to be configured for one threshold or another. However, this principle of the invention is not limited to two thresholds. It is possible to provide for the possibility of choosing between several thresholds.

In the example, the configuration circuit includes a strap 8 making it possible, if it is positioned, to short-circuit the transistor T2. This strap 8 may also be designed as a programmable fuse.

Figure 3:
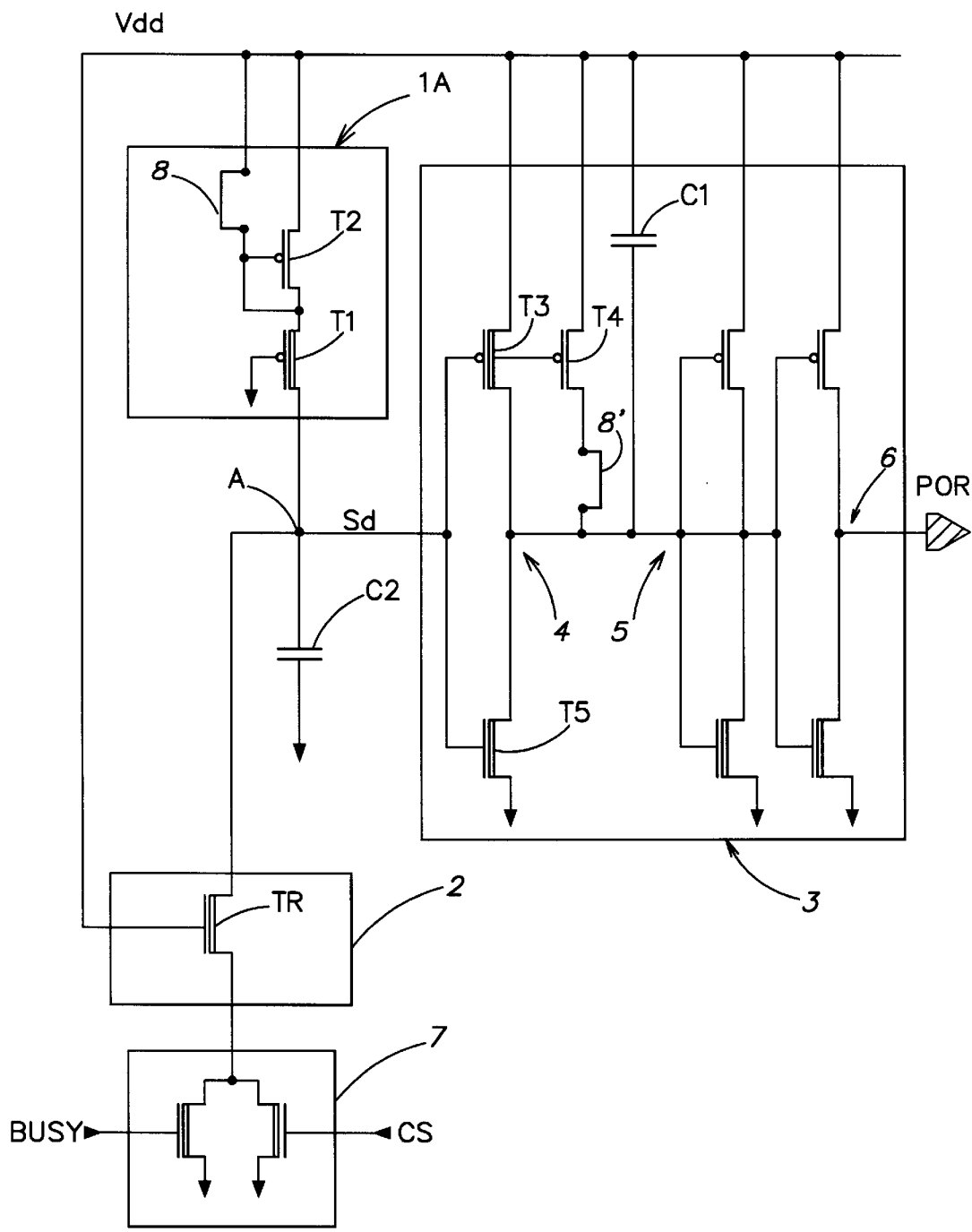
FIG. 3 shows a detailed diagram of an improved checking device comprising a dynamic detection circuit.

If the switch-over threshold value Vs is modified, it may be advantageous to provide for adapting the response of the first inverter 4 of the output stage 3. Thus, FIG. 3 shows a CMOS type inverter 4 with a first upper transistor T3, a second upper transistor T4 and a lower transistor T5. The two upper transistors are P type transistors. The first upper transistor T3 is a native transistor like the N type lower transistor T5. The second upper transistor T4 is enhanced and series-connected with a circuit 8' to make it active or inactive in the inverter. This circuit 8' in the example is a physical strap used to connect or insulate the source of this transistor T4 of the output node of the inverter.

When the transistor T2 is short-circuited, the node A may rise to Vdd since the transistor T1 is mounted "on" with its gate grounded. In this example, its well is connected to Vdd. The physical strap 8' will then be closed to place the transistor T4 in the circuit.

If the transistor T2 is placed in the circuit (with the strap 8 open) the node A cannot rise higher than Vdd-Vt2. If the transistor T4 were to be in the circuit, it would leak giving rise to a consumption of current.

Then, the strap 8' opened to cut off the transistor T4. The native P type transistor T3 for its part is off even with a level Vdd-Vt2 at its gate.

In this way, through the means 8 and 8', it is possible to adapt the switch-over threshold to the intended use of the integrated circuit, namely to the customer's requirements.

According to at least one embodiment of the invention, the control device furthermore comprises a capacitor C2 connected between the node A and the ground and a control circuit 7 to control the bias circuit 2. This control circuit 7 is used to switch over or not switch over the ground to the transistor TR of the bias circuit 2, thus turning it on or off as a function of the usual mode of operation of the integrated circuit.

In the example, the control circuit 7 consists of a combinational OR function of the selection signal CS for the selection of the integrated circuit and a BUSY signal for the selection of the integrated circuit in writing mode, both being active at one. These are control circuits that are found, for example, in many serial access memory circuits. The control circuit 7 may consist of a combinational logic to activate the bias circuit 2 as soon as the prevailing mode of operation corresponds to a mode considered to be risky, and if not to turn it off. This logic therefore corresponds to the integrated circuit considered and to the desired application.

When the bias circuit 2 is off (with the transistor TR insulated from the ground), the checking device no longer consumes a significant amount of current.

However, to enable a detection of power-on or power-off operations, if any, in this configuration (with the transistor TR off), the capacitor C2 has been provided for. On the basis of a zero voltage at the node A and a signal POR at zero, if the supply voltage Vdd rises and crosses the voltage threshold Vt1 of the transistor T1, the capacitor C2 is charged gradually as soon as the voltage Vdd is greater than the threshold Vs, causing the signal POR to follow the level of the supply voltage Vdd. The output stage 3 with inverters switches over and causes the signal POR to go to zero (FIG. 1).

The device also enables the detection of a drop in voltage. Indeed, if the supply voltage Vdd drops and becomes lower than the threshold Vs, the capacitor C2 will get discharged through the arasitic drain-well diode of the P type MOS transistor T1 in particular. When the voltage at the node A drops below the threshold Vs, the stage 3 of the output switches over and the neutralization signal POR again follows the supply voltage Vdd up to zero (FIG. 1).

However, this detection of a drop in voltage is very slow due to the discharging time of the capacitor C2. The capacitor C2 thus hampers the discharging of the node A through the parasitic diode, thus hampering the detection of a drop in voltage. There is a risk of not having the time to detect the drop in voltage before it has already fallen to zero volts and, in this case, it will not have been possible for the resetting/inhibition circuitry to be activated.

Figure 4A:
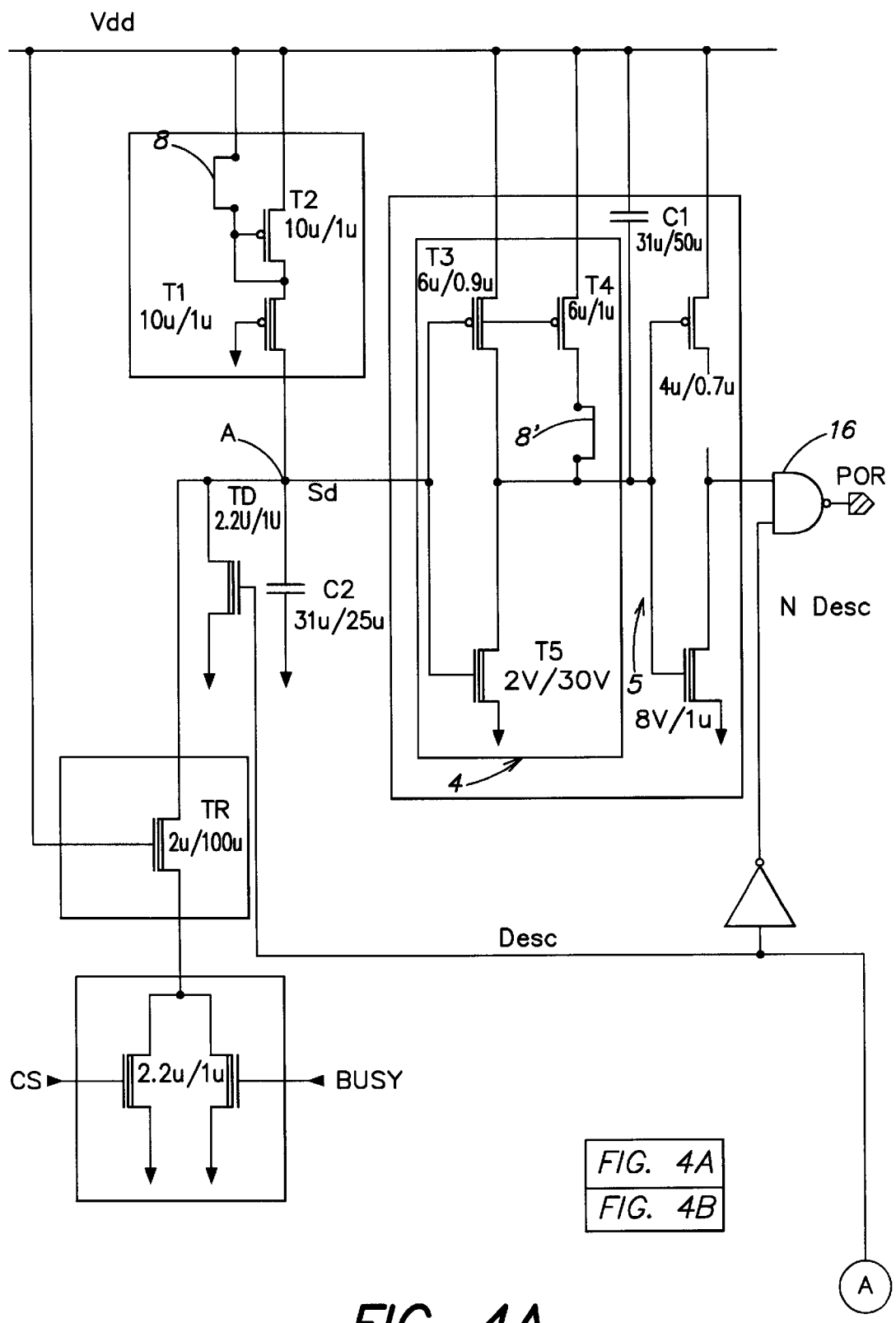
FIG. 4 represents a detailed diagram of an alternative embodiment of the dynamic detection circuit.
Figure 4B:
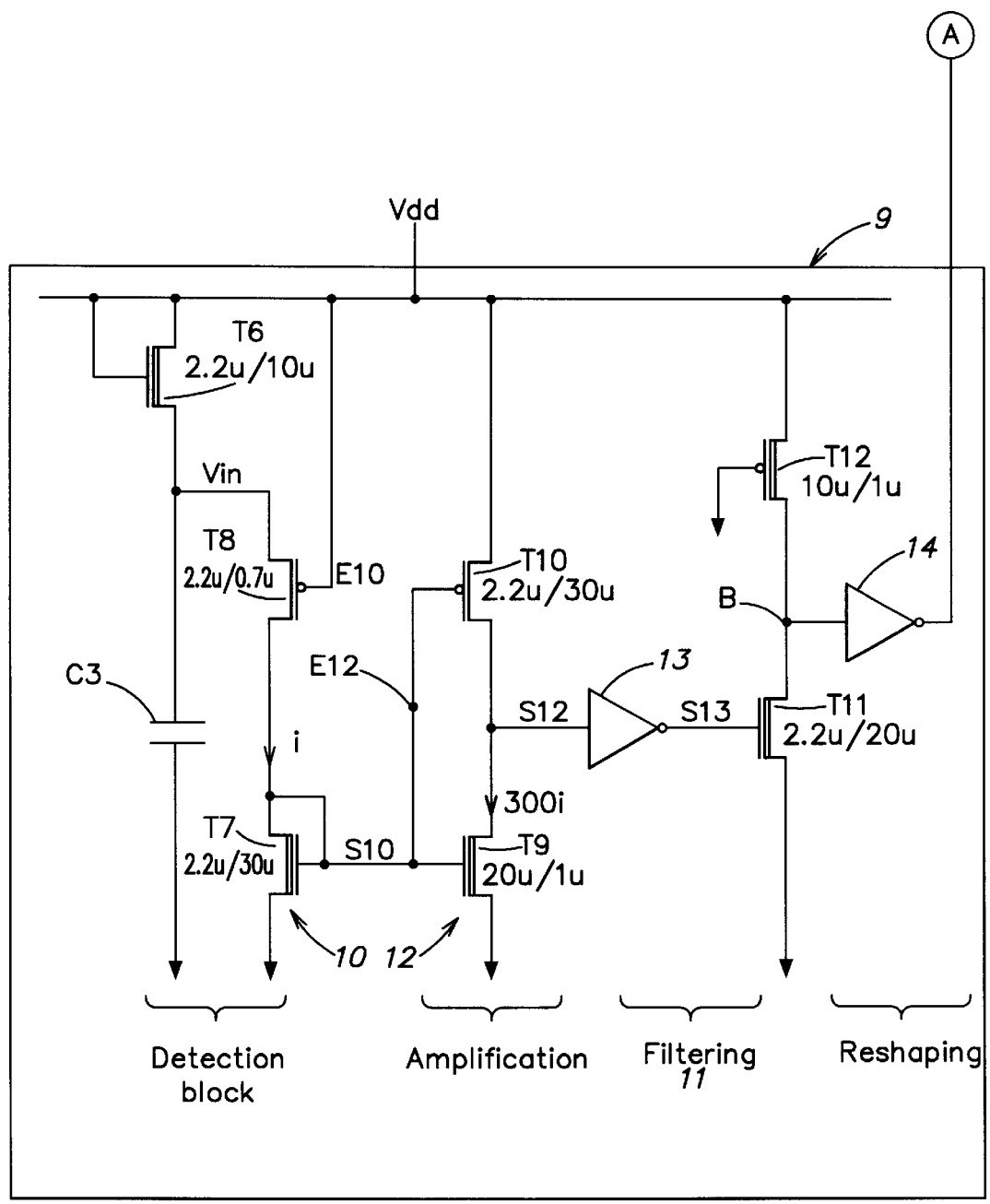

Thus, in one embodiment shown in FIG. 4, there is a circuit 9 for the dynamic detection of the drop in voltage that consumes little or no current, enabling the improvement of the response time of the control device when its bias circuit 2 is deactivated.

The improved checking device has a circuit 9 for the dynamic detection of a drop in voltage delivering a signal Desc for the detection of a drop in voltage. This signal Desc is applied to the gate of a discharging transistor TD with low resistivity. This transistor TD is connected between the node A and the ground making it possible, when it is on, to very swiftly discharge the capacitor C2 to reset its charge at zero and prepare the device for the detection of a build-up in the supply voltage. The checking device can thus confirm the drop in voltage of supply voltage Vdd. The response time of the checking device is thus improved.

In the example shown in FIG. 4, the dynamic detection circuit 9 includes a capacitor C3 charged by a native transistor T6, in the example an N type transistor, with the drain and the gate connected together to the supply voltage Vdd. The capacitor C3 is thus charged to a level ViN equal to the supply voltage Vdd minus the threshold voltage of the native transistor. This voltage ViN is applied as a supply voltage of a consumption detector 10. The detector 10 includes an N type lower transistor T7 and a P type upper transistor T8. The gate of the transistor T8 forms the input E10 of the detector. The transistor T7 is preferably a native transistor, in particular to activate the detection as soon as the transistor T7 becomes slightly conductive (as soon as the gate voltage of T7 rises to Vtnative). The drains of the transistors T7 and T8 and the gate of transistor T7 are connected in common forming the output S10 of the detector. The source of the transistor T8 receives the voltage ViN. The supply voltage Vdd is applied to the input E10 of the detector. The output S10 of the detector gives a detection signal.

Starting from a supply voltage stabilized at Vdd=Vini, the capacitor C3 is charged at Vin=Vini−Vtnnat, where Vtnnat is the threshold voltage of the native transistor T6.

Since the transistor T8 receives ViN at its source and Vdd=Vini at its gate, it is off because the difference in gate-source voltage equal to ViN−Vdd=Vtnnat is below the threshold voltage Vtp of the transistor T8.

If the supply voltage Vdd falls, the gate voltage T8 follows substantially instantaneously, while the source voltage will remain for a certain period of time at Vini−Vtnnat (a function of the time constant of the circuit). If the difference between Vini and Vdd is sufficient at the instant t, the transistor T8 becomes conductive. As soon as the transistor T8 becomes slightly conductive, the detector 10 is activated. The output S10 can thus be applied to a current amplifier system to give a signal capable of turning on the discharged transistor TD of the checking device. It is thus possible to enforce the discharging of the capacitor C2. The amplification maybe obtained by an inverter 12 that is mounted as a current mirror with the detector 10 so as to produce a very high current in the inverter 12 that is a multiple of the low current of the detector 10. The transistor T7 of the detector 10, whose gate and drain are connected together and form the output S10 of the detector, controls the gate of the lower transistor T9 and upper transistor T10 of the inverter 12. The P type transistor T10 is chosen to be resistive, for example by selecting a low W/L ratio. Its source is connected to the supply voltage Vdd. The drains of the N type transistor T9 and of the transistor T10 are connected together and form the output S12 of the inverter 12. It is the output signal S12 that may thus be applied to the discharging transistor TD associated with the capacitor C2.

The dynamic voltage drop detection circuit 9 enables the activation of the control device as soon it detects a negative transition of the order of Vtp+Vtnnat. It therefore improves the operation of the control device according to an embodiment of the invention.

However, if the supply is not stabilized, the supply voltage Vdd may oscillate. The dynamic detection circuit 9 risks bringing about cases of untimely detection which may cause uncertain operation.

Thus, in another embodiment of the invention, a filtering circuit 11 is provided at the output of the detector 10. This filtering circuit 11 makes it possible to not validate the dynamic detection unless the supply voltage Vdd falls below a specified threshold. In this way, assuming for example that the supply voltage oscillates between 5 and 7 volts, no dynamic detection will be validated if the supply voltage drops from 7 to 5 volts and then builds up again.

In order to ensure this filtering function without lowering the response time, one embodiment of the filtering circuit 11 comprises inverters 13 and 14.

The inverter 13 receives the output S12 at input. Its output S13 controls the gate of an N type transistor T11 that is resistive (with a low W/L ratio), the source of which is grounded. Its drain is connected to the drain of a P type transistor T12 of low resistivity (with a high W/L ratio) to form the output B.

The transistor T12 is biased in the on state. The source of the transistor T12 is thus placed at the supply voltage Vdd and its gate is grounded.

The output B is applied, in the example shown to the input of an inverter 14 to form a dynamic descent detection signal applied to the gate of the discharging transistor TD, in the example in an N type transistor, to turn this transistor on in the event of the detection of a drop in voltage. It will be noted in FIG. 4 that the N type transistors T7, T9 and T11 are native transistors. This makes it possible to have particularly sensitive inverters and a detector that matches the low supply voltages.

The working of the dynamic detection circuit 9 with a filtering circuit 11 of this kind is as follows.

The detector 10 lets through only a low current I so as not to swiftly discharge the capacitor C3 if the supply voltage Vdd drops. The transistor T7 is thus chosen to be resistive, e.g. with a low W/L ratio. Through the mounting of the inverter 12 as a current mirror, the output S12 is made to switch over very rapidly, so that little current goes through the detector 10. In one example, the detector 10 and the inverter 12 are configured to have a multiplier ratio of the order of 300. The high current reproduced in the inverter 12 therefore makes it switch over very rapidly. Thus, as soon as a drop in supply voltage turns the transistor T8 on, the output S12 of the inverter 12 goes from Vdd to 0, drawn to 0 by the transistor T9 (the transistor 10 being resistive).

The output of the inverter 13 therefore transitions to 1 and the transistor T11 becomes conductive, trying to draw the node B to zero. It is at this point that the filtering comes into play, through the transistor T12. Indeed, this transistor T12 may be biased so as to be always on and is chosen to be of low resistivity as compared with the transistor T11 so that it is dominant. Thus the transistor T12 tends to set the node B at Vdd.

So long as the supply voltage Vdd is sufficient to keep the transistor T12 on, it is this transistor that will predominate and Vdd will be found at the node B. If the supply voltage Vdd drops sufficiently to turn the transistor T12 off, then the node B will switch over to zero volts. The turn-off threshold corresponds to the threshold voltage Vtp of the P type transistor T12. In one example, it is native, dictating a turn-off threshold of about 1.5 volts. Thus, the assembly formed by transistors T11 and T12 constitutes a turnoff circuit that prohibits the generation of a dynamic detection pulse for the detection of a drop in voltage Desc so long as Vdd remains greater than a threshold of a native P type transistor.

The dynamic descent detection signal Desc makes it possible, as we have seen, to discharge the capacitor C2. This makes it possible to detect the drop in voltage and prepare the checking device to detect a new build-up in the supply voltage Vdd. However, it is possible to make direct use of the signal Desc for the production, through an inverter 15, of the neutralization signal POR.

Indeed, the detection pulse Desc comes more rapidly to the output of the inverter 15 than to the output of the output stage 3.

In this case, there is provision in the output stage for only the two inverters 4 and 5 and a NAND gate 16 is added for the reception, at input, of the output of the output stage 3 and the output of the inverter 15, to deliver the neutralization signal POR.

The value of the threshold voltage Vt6 of the transistor T6 for the charging of the capacitor C3 conditions the detection of the drop in voltage in the dynamic detection circuit 9.

Indeed, if Vt6 is excessively high, the voltage ViN=Vini−Vt6 is reduced to the same extent. If the supply voltage has a low stabilized value Vini, there is a risk of not being able to turn the transistor T8 on.

To turn the transistor T8 on, it is necessary to have Vini>Vdd+Vt6+Vtp.

For a low stabilized voltage Vini, it is recommended to reduce the second term to the greatest possible extent. In a given MOS technology, the threshold voltage of the native P type transistors is defined and is thus fixed by this technology. Action can therefore be taken only on the threshold voltage of the N type transistors. There are known ways of making different threshold values of native transistors by using a so-called "twin-tub" technology with two dopings of the substrate or again a so-called P well technology, for a P substrate. In this arrangement, native N type transistor are in the P type well with a threshold voltage greater than that of the native N type transistors made in the substrate. There will be, for example, respectively 400 millivolts and 100 millivolts.

If a native transistor T6 is used with a very low threshold voltage (100 millivolts), the detection is improved for low supply levels Vini.

However, at the high temperatures (50° C.), since the threshold voltage of a transistor is reduced (by 2 mv/° C.), this transistor T6 will leak, discharging the capacitor C3. The voltage Vin then falls with Vdd, preventing the transistor T8 from conducting. Hence, with a charging transistor T6 having an excessively low threshold voltage, it is no longer possible to detect a drop in voltage at high temperature.

Figure 5:
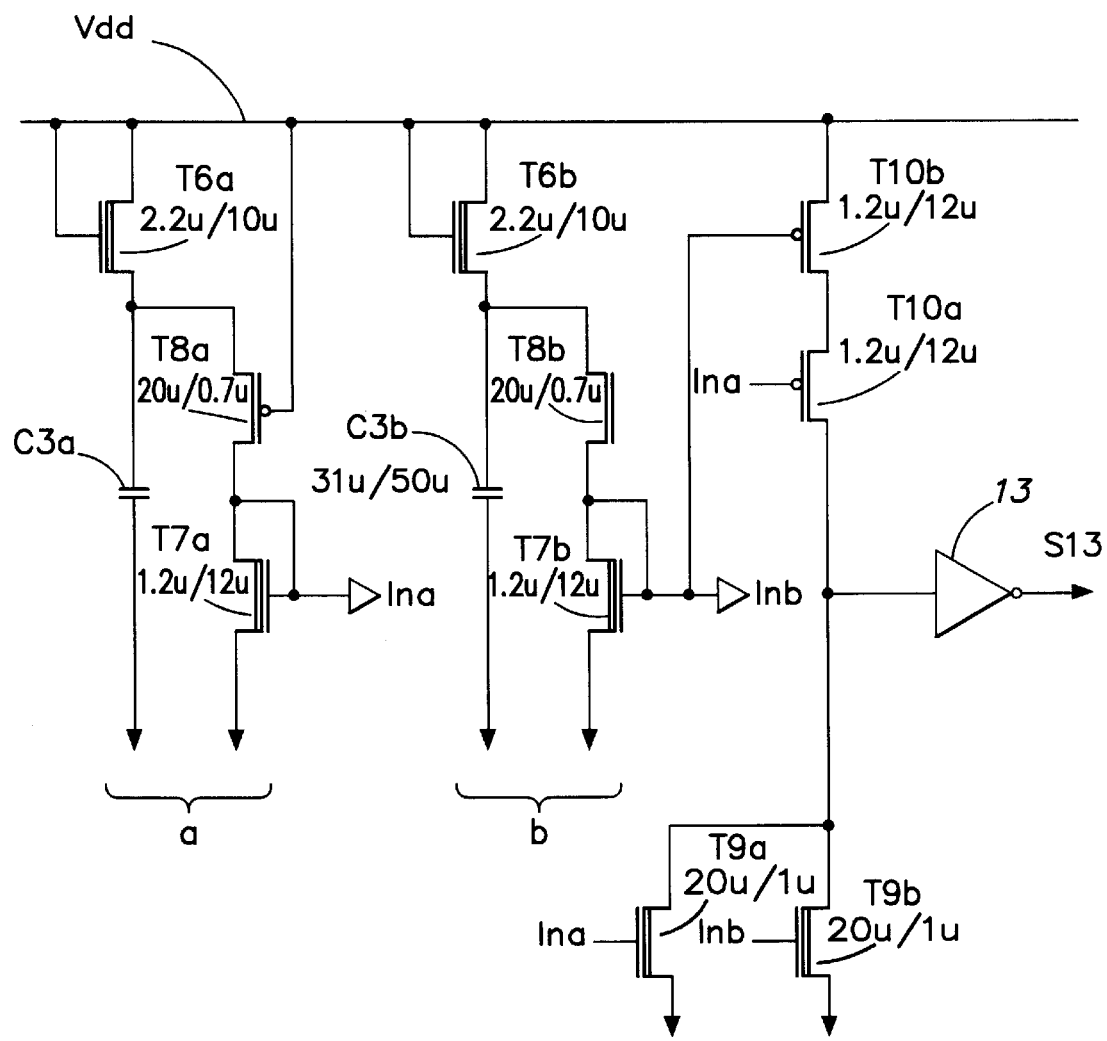
FIG. 5 represents a detailed diagram of another alternative embodiment of the dynamic detection circuit.

To extend the range of detection and temperature, in one variant shown in FIG. 5, there is provision for duplicating the detection block. In this circuit, a block a with a charging transistor T6a, a capacitor C3a and a detector 10a delivers an output Ina. There is also a block b, with a charging transistor T6b, a capacitor C3b, a detector 10b that delivers an output Inb. The transistor T6a has a low threshold voltage close to zero (100 mv), enabling detection at low Vini. The transistor T6b has a higher threshold voltage (400 mv) enabling detection at high temperature. The inverter 12 then includes a combinational logic function to obtain the logic OR of the two detection outputs Ina and Inb.

In the example of FIG. 5, there are then two upper transistors T10a aned T10b that are series-connected respectively receiving the signal Ina and the signal Inb at their gate and two parallel-connected lower transistors T9a and T9b respectively receiving the signal Ina and the signal Inb at their gate. For a given temperature range, the detection of the block with the highest performance may be taken into account.

FIGS. 4 and 5 show the dimensions of the different elements as examples of practical embodiments of the invention. It will be noted that all the N type transistors in these examples are native type transistors. This makes it possible in particular to have a control device that is adapted to the low supply voltages.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only, and is not intended as limiting. The invention is limited only as defined in the following claims and the equivalents thereto.

What is claimed is:

1. An integrated circuit power-on/power-off checking device comprising:
   an output stage having an input and an output that provides a neutralization signal capable of controlling the initialization and inhibition of electronic functions of the integrated circuit;
   a voltage reference circuit having an input that receives a supply voltage and an output that is coupled to the input of the output stage;
   a bias circuit coupled to the output of the voltage reference circuit;
   a control circuit coupled to the bias circuit, the control circuit being constructed and arranged to activate and deactivate the bias circuit as a function of a prevailing mode of operation of the integrated circuit; and
   a capacitor coupled between the output of the voltage reference circuit and a ground enabling detection of power-on or power-off operations;
   further comprising a discharge transistor, coupled in parallel to the capacitor, the discharge transistor discharging the capacitor in response to a drop in the supply voltage.

2. The checking device of claim 1, further comprising means to configure the checking device for one of a plurality of switch-over thresholds.

3. The checking device of claim 1, wherein the output stage comprises at least one inverter and one starting capacitor connected between the supply voltage and the output of said inverter, wherein the starting capacitor is sized to dictate a minimum pulse duration to the signal delivered by said output stage.

4. An integrated circuit power-on/power-off checking device comprising:
   an output stage having an input and an output that provides a neutralization signal capable of controlling the initialization and inhibition of electronic functions of the integrated circuit;
   a voltage reference circuit having an input that receives a supply voltage and an output that is coupled to the input of the output stage;
   a bias circuit coupled to the output of the voltage reference circuit;
   a control circuit coupled to the bias circuit, the control circuit being constructed and arranged to activate and deactivate the bias circuit as a function of a prevailing mode of operation of the integrated circuit; and
   a capacitor coupled between the output of the voltage reference circuit and a ground enabling detection of power-on or power-off operations;
   further comprising a discharge transistor, coupled to the capacitor, the discharge transistor discharging the capacitor in response to a drop in the supply voltage;
   further comprising a dynamic detection circuit coupled to the discharge transistor, the dynamic detection circuit including:
   a detection capacitor;
   a detection block including a detection transistor that charges the detection capacitor; and
   a consumption detector supplied by a voltage across the detection capacitor, the consumption detector having an input that receives he supply voltage and an output that provides a detection signal that controls the discharge transistor;
   wherein the detection transistor and detection capacitor are series-connected between the supply voltage and ground.

5. The checking device of claim 4, wherein the detection transistor has a threshold voltage close to zero.

6. An integrated circuit power-on/power-off checking device comprising:
   an output stage having an input and an output that provides a neutralization signal capable of controlling the initialization and inhibition of electronic functions of the integrated circuit;
   a voltage reference circuit having an input that receives a supply voltage and an output that is coupled to the input of the output stage;

a bias circuit coupled to the output of the voltage reference circuit;

a control circuit coupled to the bias circuit, the control circuit being constructed and arranged to activate and deactivate the bias circuit as a function of a prevailing mode of operation of the integrated circuit; and a capacitor coupled between the output of the voltage reference circuit and a ground enabling detection of power-on or power-off operations;

further comprising a discharge transistor, coupled to the capacitor, the discharge transistor discharging the capacitor in response to a drop in the supply voltage;

further comprising a dynamic detection circuit coupled to the discharge transistor, the dynamic detection circuit including:

a detection capacitor;

a detection block including a detection transistor that charges the detection capacitor; and a consumption detector supplied by a voltage across the detection capacitor, the consumption detector having an input that receives he supply voltage and an output that provides a detection signal that controls the discharge transistor;

wherein the detection transistor and detection capacitor are series-connected between the supply voltage and ground; and wherein the dynamic detection circuit further comprises an amplifier inverter that is unbalanced to switch over when the detection block lets through current, said amplifier inverter having an output that provides a signal that controls the discharge transistor.

7. The checking device of claim 6, wherein the detection signal is combined with the signal delivered by the output stage to form the neutralization signal.

8. An integrated circuit power-on/power-off checking device comprising:

an output stage having an input and an output that provides a neutralization signal capable of controlling the initialization and inhibition of electronic functions of the integrated circuit;

a voltage reference circuit having an input that receives a supply voltage and an output that is coupled to the input of the output stage;

a bias circuit coupled to the output of the voltage reference circuit;

a control circuit coupled to the bias circuit, the control circuit being constructed and arranged to activate and deactivate the bias circuit as a function of a prevailing mode of operation of the integrated circuit; and a capacitor coupled between the output of the voltage reference circuit and a ground enabling detection of power-on or power-off operations;

further comprising a discharge transistor, coupled to the capacitor, the discharge transistor discharging the capacitor in response to a drop in the supply voltage;

further comprising a dynamic detection circuit coupled to the discharge transistor, the dynamic detection circuit including:

a detection capacitor, a detection block including a detection transistor that charges the detection capacitor; and a consumption detector supplied by a voltage across the detection capacitor, the consumption detector having an input that receives he supply voltage and an output that provides a detection signal that controls the discharge transistor;

wherein the detection transistor and detection capacitor are series-connected between the supply voltage and ground; and wherein the dynamic detection circuit further comprises a filtering circuit including:

a resistive transistor;

a low resistivity transistor coupled to the resistive transistor, the low resistivity transistor being biased to be always on so long as the supply voltage is greater than a threshold voltage of the low resistivity transistor; and a first inverter having an output that controls a gate of the resistive transistor;

wherein a connection point between the resistive transistor and the low resistivity transistor provides a descent detection signal to a gate of the discharge transistor.

9. An integrated circuit power-on/power-off checking device comprising:

an output stage having an input and an output that provides a neutralization signal capable of controlling the initialization and inhibition of electronic functions of the integrated circuit;

a voltage reference circuit having an input that receives a supply voltage and an output that is coupled to the input of the output stage;

a bias circuit coupled to the output of the voltage reference circuit;

a control circuit coupled to the bias circuit, the control circuit being constructed and arranged to activate and deactivate the bias circuit as a function of a prevailing mode of operation of the integrated circuit; and a capacitor coupled between the output of the voltage reference circuit and a ground enabling detection of power-on or power-off operations;

further comprising a discharge transistor, coupled to the capacitor, the discharge transistor discharging the capacitor in response to a drop in the supply voltage;

further comprising a dynamic detection circuit coupled to the discharge transistor, the dynamic detection circuit including:

a detection capacitor;

a detection block including a detection transistor that charges the detection capacitor; and a consumption detector supplied by a voltage across the detection capacitor, the consumption detector having an input that receives he supply voltage and an output that provides a detection signal that controls the discharge transistor;

wherein the detection transistor and detection capacitor are series-connected between the supply voltage and ground; and wherein the dynamic detection circuit comprises two parallel-connected detection blocks with, in one block, a charging transistor with a threshold close to zero, the outputs of the two parallel-connected detection blocks being combined into an OR logic circuit in the dynamic detection circuit.

10. A circuit for inhibiting operation of an integrated circuit, comprising:

a voltage reference circuit having an input that receives a supply voltage and an output that provides a detection signal indicative of the supply voltage;

a bias circuit coupled to the output of the voltage reference circuit;

a control circuit having an input that receives a signal indicative of the operational mode of the integrated circuit, and an output that deactivates the bias circuit in response to the signal indicative of the operational mode; and a capacitor coupled between the output of the voltage reference circuit and a ground, enabling detection of power-on or power-off operations.

11. The circuit of claim 10, further comprising a shaping circuit having an input that receives the detection signal and an output that provides a power-on control signal to the integrated circuit.

12. The circuit of claim 11, wherein the shaping circuit includes a plurality of seriescoupled inverters.

13. The circuit of claim 11, wherein the shaping circuit includes a delay capacitor that delays switching of the power-on control signal.

14. The circuit of claim 10, further comprising a starting capacitor coupled to the output of the voltage reference circuit, the starting capacitor delaying switching of the detection signal.

15. The circuit of claim 10, wherein the voltage reference circuit has a second input that comprises programmable means that selects one of two different voltages in response to which the voltage reference circuit activates the detection signal.

16. The circuit of claim 15, wherein the voltage reference circuit includes a first reference transistor and a second reference transistor series coupled together, the first reference transistor being controlled by said programmable means.

17. The circuit of claim 15, further comprising a shaping circuit having a first input that receives the detection signal, a second input indicative of the one of two different voltages, and an output that provides a power-on control signal to the integrated circuit.

18. A circuit for inhibiting operation of an integrated circuit, comprising:

a voltage reference circuit having an input that receives a supply voltage and an output that provides a detection signal indicative of the supply voltage;

a bias circuit coupled to the output of the voltage reference circuit;

a control circuit having an input that receives a signal indicative of the operational mode of the integrated circuit, and an output that deactivates the bias circuit in response to the signal indicative of the operational mode; and a capacitor coupled between the output of the voltage reference circuit and a ground, enabling detection of power-on or power-off operations;

a starting capacitor coupled to the output of the voltage reference circuit, the starting capacitor delaying switching of the detection signal;

further comprising a detection circuit that discharges the starting capacitor in response to the supply voltage.

19. A circuit for inhibiting operation of an integrated circuit, comprising:

a voltage reference circuit having an input that receives a supply voltage and an output that provides a detection signal indicative of the supply voltage;

a bias circuit coupled to the output of the voltage reference circuit;

a control circuit having an input that receives a signal indicative of the operational mode of the integrated circuit, and an output that deactivates the bias circuit in response to the signal indicative of the operational mode; and a capacitor coupled between the output of the voltage reference circuit and a ground, enabling detection of power-on or power-off operations;

a starting capacitor coupled to the output of the voltage reference circuit, the starting capacitor delaying switching of the detection signal;

a detection circuit that discharges the starting capacitor in response to the supply voltage;

wherein the detection circuit includes:

a voltage detector that senses the supply voltage and generates an interim signal;

an amplification circuit having an input that receives the interim signal and an output that provides an amplified signal; and a filtering circuit having an input that receives the amplified signal and an output that provides a filtered signal that controls discharging of the starting capacitor.

20. A method for inhibiting operation of an integrated circuit, comprising the steps of:

sensing the operational state of the integrated circuit to be one of a first state and a second state;

activating a bias control circuit when the operational state of the integrated circuit is the first state;

wherein the step of activating includes allowing a bias current to flow through a voltage reference circuit that senses a supply voltage of the integrated circuit;

deactivating the bias control circuit when the operational state of the integrated circuit is the second state; and detecting power-on or power-off operations using a capacitor coupled between an output of the voltage reference circuit and a ground;

further comprising the steps, performed in response to the step of activating, of:

generating a detection signal indicative of a value of the supply voltage; and delaying activation of the detection signal.

21. The method of claim 20, further comprising the step of selecting a reference voltage from a plurality of reference voltages, the power-on circuit providing a detection signal based upon a comparison of the reference voltage and the supply voltage.

22. An apparatus for inhibiting operation of an integrated circuit, comprising:

means for sensing the operational state of the integrated circuit to be one of a first state and a second state;

means for activating a bias control circuit when the operational state of the integrated circuit is the first state;

wherein the means for activating includes means for allowing a bias current to flow through a voltage reference circuit that senses a supply voltage of the integrated circuit;

means for deactivating the bias control circuit when the operational state of the integrated circuit is the second state; and means for detecting power-on or power-off operations using a capacitor coupled between an output of the voltage reference circuit and a ground;

further comprising:
means for generating a detection signal indicative of a value of the supply voltage; and
means for delaying activation of the detection signal.

23. The apparatus of claim 22, further comprising means for selecting a reference voltage from a plurality of reference voltages, the power-on circuit providing a detection signal based upon a comparison of the reference voltage and the supply voltage.

24. An apparatus for inhibiting operation of an integrated circuit, comprising:
means for selecting a reference voltage from a plurality of reference voltages; and
means for providing a power-on signal to the integrated circuit based upon a comparison of the reference voltage and a supply voltage of the integrated circuit;
wherein the means for providing includes means for allowing a bias current to flow through a voltage reference circuit that senses the supply voltage of the integrated circuit;
and means for activating or deactivating the means for allowing as a function of a mode of operation of the integrated circuit and a capacitor coupled between an output of the voltage reference circuit and a ground;
wherein the means for providing a power on signal includes:
means for generating a detection signal indicative of a value of the supply voltage; and
means for delaying activation of the detection signal.

25. A method for inhibiting operation of an integrated circuit, comprising the steps of:
sensing the operational state of the integrated circuit to be one of a first state and a second state;
activating a bias control circuit when the operational state of the integrated circuit is the first state;
wherein the step of activating includes allowing a bias current to flow through a voltage reference circuit that senses a supply voltage of the integrated circuit;
deactivating the bias control circuit when the operational state of the integrated circuit is the second state; and
detecting power-on or power-off operations using a capacitor coupled between an output of the voltage reference circuit and a ground;

further comprising dynamically detecting a drop in supply voltage and discharging the capacitor upon such a detection.

26. An apparatus for inhibiting operation of an integrated circuit, comprising:
means for sensing the operational state of the integrated circuit to be one of a first state and a second state;
means for activating a bias control circuit when the operational state of the integrated circuit is the first state;
wherein the means for activating includes means for allowing a bias current to flow through a voltage reference circuit that senses a supply voltage of the integrated circuit;
means for deactivating the bias control circuit when the operational state of the integrated circuit is the second state; and
means for detecting power-on or power-off operations using a capacitor coupled between an output of the voltage reference circuit and a ground;
further comprising means for dynamically detecting a drop in supply voltage and means for control discharging of the capacitor upon such a detection.

27. An apparatus for inhibiting operation of an integrated circuit, comprising:
means for selecting a reference voltage from a plurality of reference voltages; and
means for providing a power-on signal to the integrated circuit based upon a comparison of the reference voltage and a supply voltage of the integrated circuit;
wherein the means for providing includes means for allowing a bias current to flow through a voltage reference circuit that senses the supply voltage of the integrated circuit;
and means for activating or deactivating the means for allowing as a function of a mode of operation of the integrated circuit and a capacitor coupled between an output of the voltage reference circuit and a ground;
further comprising means for dynamically detecting a drop in supply voltage and means to control discharging of the capacitor upon such a detection.

* * * * *

UNITED STATES PATENT AND TRADEMARK OFFICE
CERTIFICATE OF CORRECTION

PATENT NO.    : 6,281,723 B1
DATED         : August 28, 2001
INVENTOR(S)   : Francois Tailliet It is certified that error appears in the above-identified patent and that said Letters Patent is hereby corrected as shown below:

<u>Title page,</u>
Items [75] and [56] should read as follows,
-- [75] Inventor: Francois Tailliet, Epinay S/Sceine (FR)

[56]    References Cited
                U.S. PATENT DOCUMENTS
4,902,910    02/20/90    Hsieh...................307/296
5,164,613    11/17/92    Mumper et al..............307/272

FOREIGN PATENT DOCUMENTS
EP-A-0 700 159    03/06/96    SGS-Thomson Microelectronics, S.r.l.    H03K/17/22
EP-A-0 665 648    08/02/95    SGS-Thomson Microelectronics, S.r.l.    H03K/17/22
EP-A-0 421 124    04/10/91    Texas Instruments, Inc.                 H03K/17/22 --

Signed and Sealed this

Fourteenth Day of May, 2002

*Attest:*

*Attesting Officer*

JAMES E. ROGAN
*Director of the United States Patent and Trademark Office*